US012615036B2

(12) United States Patent
Wong et al.

(10) Patent No.: US 12,615,036 B2
(45) Date of Patent: Apr. 28, 2026

(54) FAST CLOCK SWITCHING DEGLITCH CIRCUIT

(71) Applicant: Silicon Laboratories Inc., Austin, TX (US)

(72) Inventors: Tak Ying Wong, Singapore (SG); Hua Beng Chan, Singapore (SG); Yun Da Bryan Seah, Mountain View, CA (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 18/901,306

(22) Filed: Sep. 30, 2024

(65) Prior Publication Data

US 2026/0095157 A1 Apr. 2, 2026

(51) Int. Cl.
*H03K 3/037* (2006.01)
*G06F 1/08* (2006.01)

(52) U.S. Cl.
CPC ............... *H03K 3/037* (2013.01); *G06F 1/08* (2013.01)

(58) Field of Classification Search
CPC .................................. H03K 3/037; G06F 1/08
USPC .......................................................... 327/225
See application file for complete search history.

(56) References Cited

U.S. PATENT DOCUMENTS 10,715,124 B2 * 7/2020 Zhang ........................ G06F 1/04
2008/0079501 A1 4/2008 Hulfachor et al.
2024/0353888 A1 * 10/2024 Lentz ........................ G06F 1/08
2025/0357928 A1 * 11/2025 Chan .............. H03K 19/018528

* cited by examiner

*Primary Examiner* — Tomi Skibinski
(74) *Attorney, Agent, or Firm* — Zagorin Cave LLP

(57) ABSTRACT

A fast approach to switching between first and second asynchronous clock signals with reduced latency is provided. When the clock select signal indicates a switch from the first clock signal to the second clock signal, the switch is not made immediately. Instead a blanking signal is generated to suppress the glitch before switching clocks internally. The start of the blanking signal is based on the last falling edge of the internal clock signal before the switch and the end of the blanking signal is based on the first falling edge of the internal clock signal after the switch. The first falling edge is the falling edge of the glitch. The glitchy internal clock is logically combined with the blanking signal to generate an output clock signal that is glitch-free.

20 Claims, 8 Drawing Sheets

FAST CLOCK SWITCHING DEGLITCH CIRCUIT

BACKGROUND

Field of the Invention

This disclosure relates to glitchless switching between asynchronous clock signals.

Description of the Related Art

It is common for systems to switch from one clock signal to another clock signal, e.g., for redundancy or following a power up sequence once a faster and cleaner clock is available. Referring to FIG. 1, assume there are two asynchronous input clock signals CLK_A and CLK_B having different frequencies. The select circuit 102 selects one of the two clock signals as the output clock signal CLK_OUT according to a value of the select signal 104. The select signal 104 asynchronously selects one of the two clock signals. FIG. 2 illustrates clock signals CLK_A and CLK_B, the select signal, and the CLK_OUT signal. Initially, CLK_B is being selected as the output clock signal. The select signal switches at 202 to select CLK_A as the output clock signal. The switch occurs in the middle of the high portion 204 of CLK_A. That results in a glitch or a narrower high portion of the clock period at 206. Such glitches can cause problems in digital systems and therefore solutions to eliminate such glitches on switching clock signals have been implemented.

FIGS. 3 and 4 illustrate a conventional approach to suppress the glitch that skips one input clock period after the glitch to implement the glitch-free clock switching process. Referring to FIG. 3 the input clocks are clk_in[0] and clk_in[1]. There are two select signals, clksel[0] and clksel [1]. The select signals are complementary so that when one select signal is a logical high, the other select signal is a logical low. Clksel[0] is supplied to AND gate 302. Clksel [1] selects clk_in[1] when asserted and is supplied to AND gate 304. Clk_in[0] is supplied to AND gate 306 and to flip-flops 308 and 310. Flip-flop 310 is clocked by an inverted version of clk_in[0]. Clk_in[1] is supplied to AND gate 312 and to flip-flops 314 and 316. Flip-flop 316 is clocked by an inverted version of clk_in[1].

FIG. 4 illustrates the operation of the glitch suppression circuit of FIG. 3. Initially clksel[0] is asserted thereby selecting clk_in[0] as clk_out. Clk_sel[1] is deasserted when clksel[0] is asserted and vice versa. Clk_sel[0] deasserts at 402 resulting in clk_sel_qual_q[0] deasserting at 404 on the negative edge of clk_in[0]. That allows clksel[1] to pass through AND gate 304 and flip-flop 316 outputs an asserted clksel_qual_q[1] on the negative edge of clk_in[1] at 404. An asserted clksel_qual_q[1] allows clk_in[1] to pass through AND gate 312 and the deasserted clksel_qual_q[0] ensures the output from AND gate 306 is zero. OR gate 320 supplies the selected clock signal. The clock switch is complete at 406 with a glitchless transition having occurred from clk_in[0] to clk_in[1]. The transition had a lag 410 between output of clk_in[0] and clk_in[1]. Since clksel_qual_q[0] masks off the positive edge of the first clk_in[1] after clksel[0] changes, the first clk_in[1] rising and falling edge during period 412 is skipped so that the glitch-free clock output is achieved. Even after clksel_qual_q[0] is removed, 2 edges of clk_in[1] during clock period 414 are still not present in clk_out. As a result the latency for the clock switching process is longer than desirable.

SUMMARY OF EMBODIMENTS OF THE INVENTION

It would be desirable to reduce the lag when switching between asynchronous clock signals. Accordingly, in an embodiment a method includes switching a source for an output clock signal from a first clock signal to a second clock signal according to a change in value of a select signal, the first and second clock signals being asynchronous. The method further includes generating a delayed select signal that is a delayed version of the select signal and generating an internal clock signal according to the delayed select signal, the internal clock signal corresponding to the first clock signal according to a first value of the delayed select signal and the internal clock signal corresponding to the second clock signal according to a second value of the delayed select signal. The internal clock signal is generated with a narrower high portion that is narrower than a high portion of the second clock signal responsive to a change of the delayed select signal, the narrower high portion being indicative of a clock glitch. The method further includes generating a masking signal to mask the clock glitch in the output clock signal and generating the output clock signal by logically combining the internal clock signal and the masking signal.

In another embodiment an apparatus includes a selector circuit to switch a source for an internal clock signal from a first clock signal to a second clock signal according to an internal switch signal, the first and second clock signals being asynchronous. The internal clock signal has a narrower high portion than a high portion of the second clock signal during a first period of the internal clock signal after the switch from the first clock signal to the second clock signal, the narrower high portion indicative of a glitch. Masking logic generates a masking signal that is asserted during the glitch. A logic circuit logically combines the internal clock signal and the masking signal to generate an output clock signal.

In another embodiment an apparatus includes a selector circuit to switch a source for an internal clock signal from a first clock signal to a second clock signal responsive to a change in value of a delayed select signal, the first and second clock signals being asynchronous. The internal clock signal has a narrower high portion during a first period of the internal clock signal after the switch from the first clock signal to the second clock signal, the narrower high portion being narrower than a next high portion of the internal clock signal after the narrower high portion. Masking logic generates a masking signal that is asserted during the narrower high portion. A logic circuit logically combines the internal clock signal and the masking signal to generate an output clock signal. The masking signal is enabled responsive to a last falling edge of the internal clock signal before the switch and the masking signal is disabled responsive to a first falling edge of the internal clock signal after the switch.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
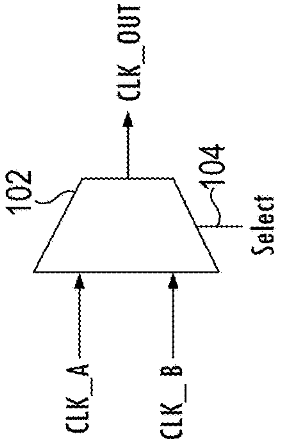
FIG. 1 illustrates a select circuit to select an output clock signal.
Figure 2:
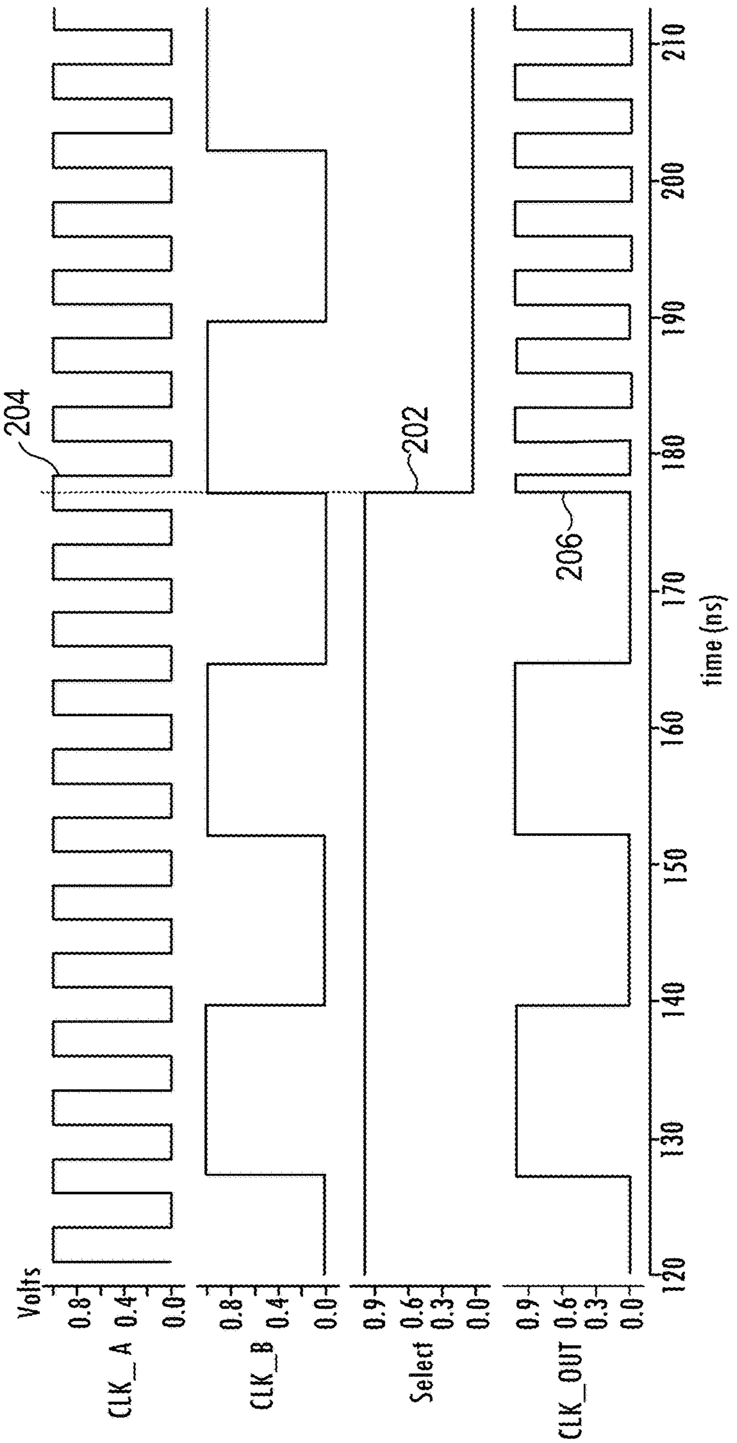
FIG. 2 illustrates how a glitch occurs when switching between clock signals.
Figure 3:
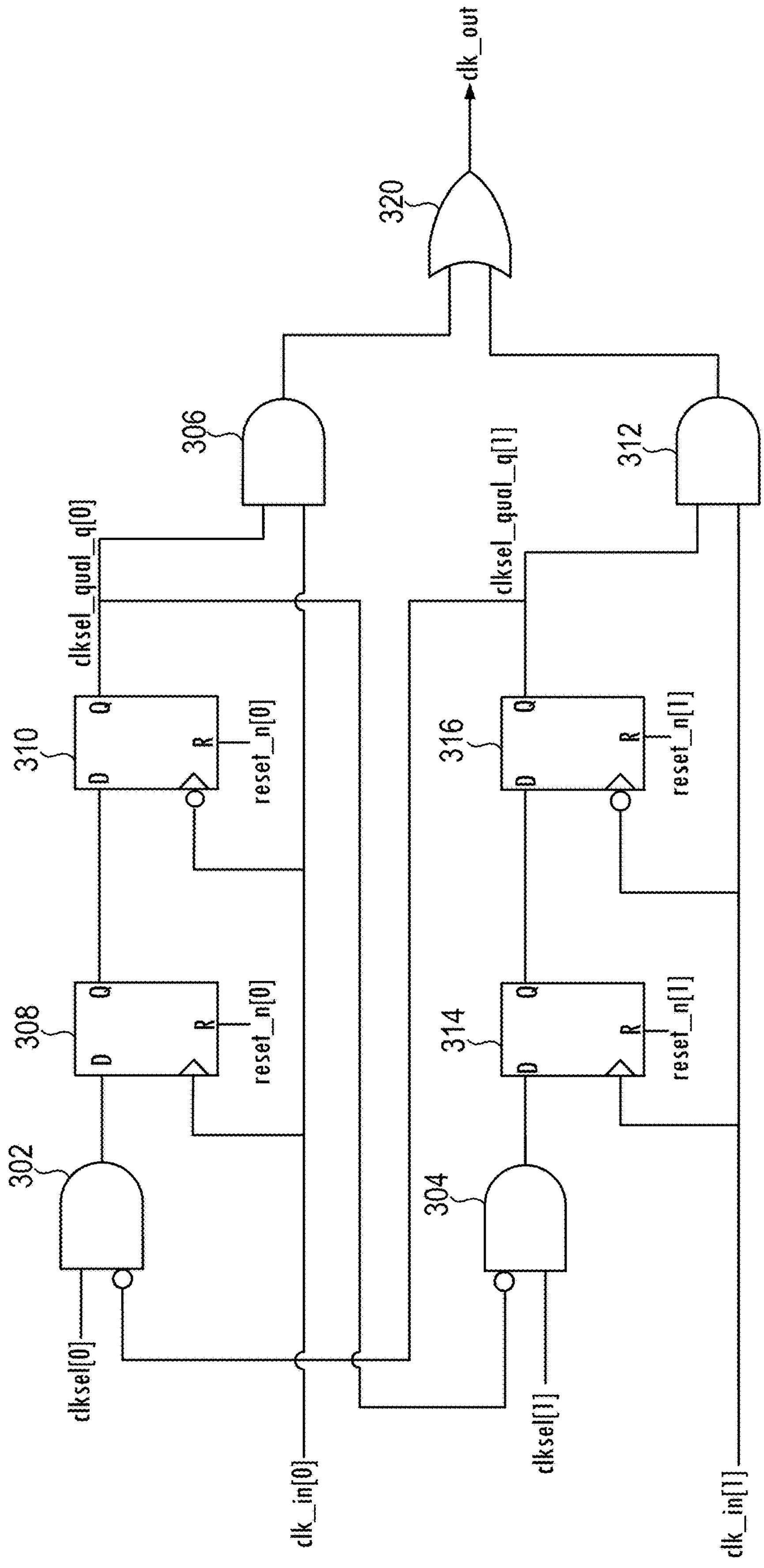
FIG. 3 illustrates a conventional circuit to suppress a glitch when switching between asynchronous clock signals.
Figure 4:
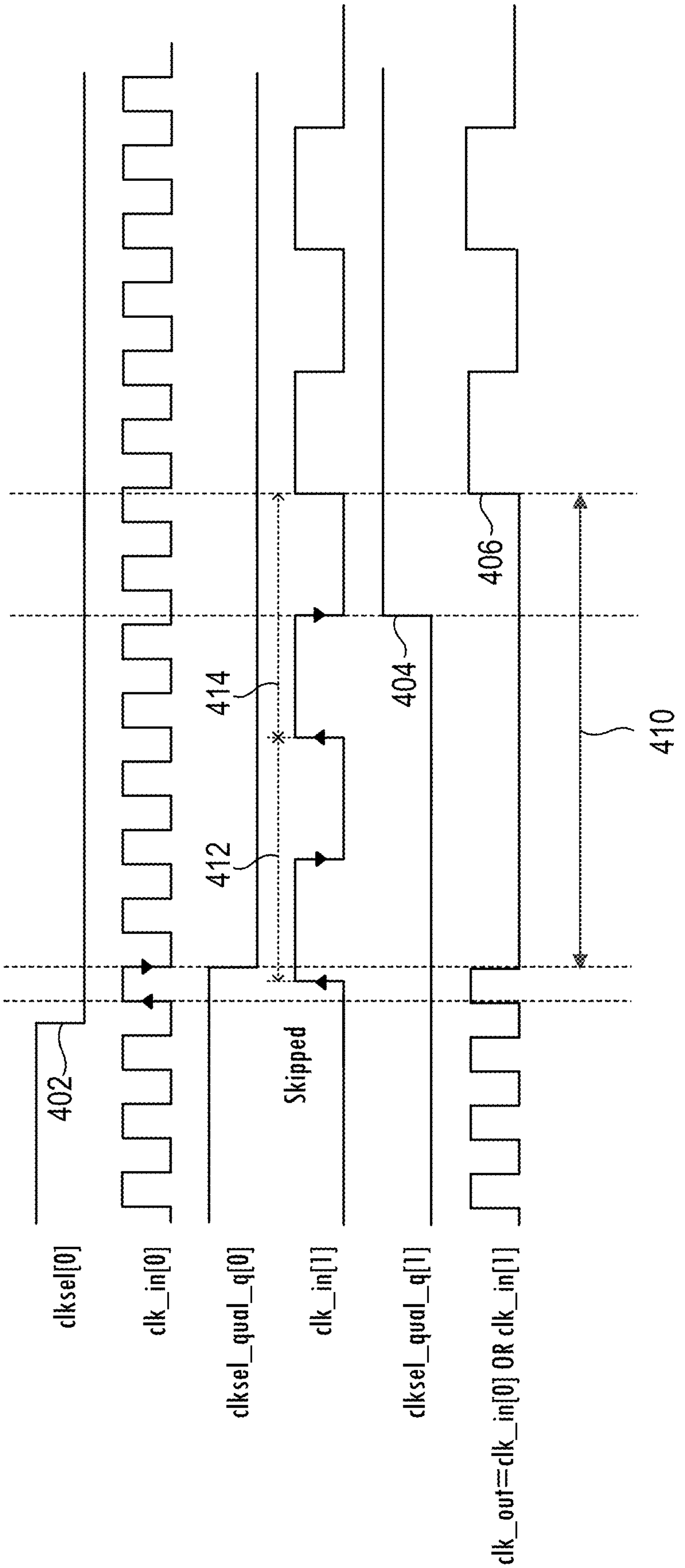
FIG. 4 is a timing diagram illustrating operation of the conventional circuit of FIG. 3.

It would be desirable to have a glitch-free output clock signal and to reduce the latency from supplying one clock signal as the output clock signal to supplying another clock signal as the output clock signal. Accordingly, rather than the synchronous approach used in the example of FIGS. 3 and 4, embodiments herein use an asynchronous approach for faster clock switching. When the clock select signal indicates a switch, the switch is not made immediately. Instead a blanking signal blankb is generated to suppress the glitch before switching clocks internally responsive to a delayed select signal that is a delayed version of the select signal. The blankb signal starts to mask the "coming soon" glitch. Then the clocks are switched internally to generate an internal clock that is not glitch-free. At the next edge of the non-glitch-free internal clock, the blankb signal is disabled to remove the mask and output a glitch-free output clock signal.

Figure 5:
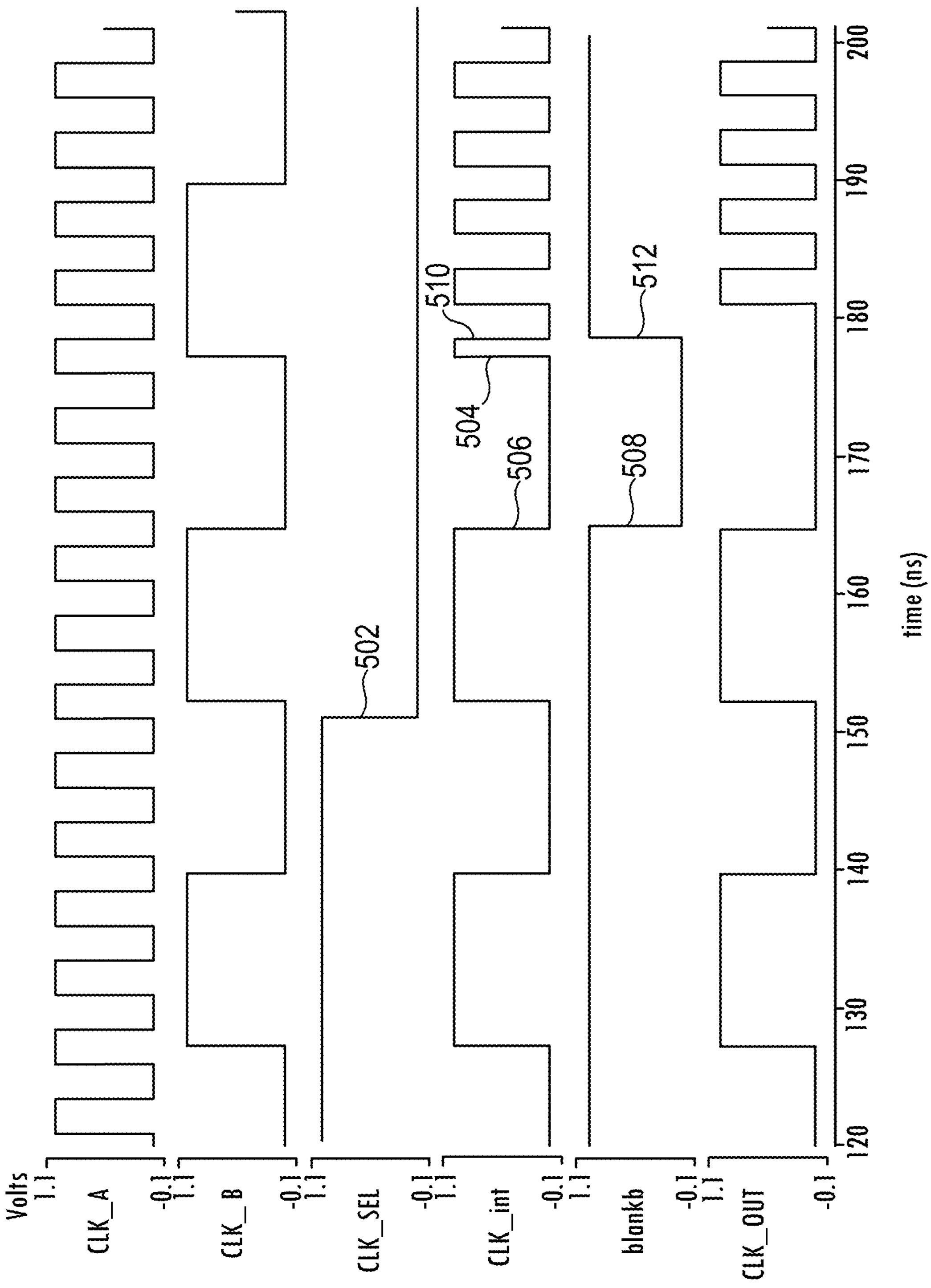
FIG. 5 is a timing diagram illustrating an asynchronous approach for glitchless switching that achieves faster switching.

FIG. 5 is a timing diagram illustrating an approach for fast processing. Initially the select signal (CLK_SEL) is a logic high thereby selecting CLK_B as the output clock signal CLK_OUT. The select signal (CLK_SEL) switches at 502 to select CLK_A. But the switch is delayed until 504. Before the switch at 504 the output clock CLK_OUT corresponds to CLK_B and after the switch CLK_OUT corresponds to CLK_A. An internal glitchy clock CLK_int can be seen to switch after one cycle of CLK_B resulting in a glitch (narrower high portion) in the internal glitchy CLK_int beginning at 504. The glitchy clock CLK_int is used to create the blanking pulse blankb to suppress the glitch in CLK_OUT. The edge 506 (before the glitch) of the internal glitchy clock is used to create the falling edge of the blanking pulse blankb having a first edge at 508. The edge 506 is the last falling edge of CLK_int before the switch. The glitch at 504, i.e., the clock period with the narrower logically high portion as compared to a normal CLK_A high portion, is used to define the end of the masking period. Thus, the falling edge 510 of the glitchy period is used to cause the rising edge of the blankb signal at 512. Thus, the first falling edge of CLK_int after the switch is used to end the masking. Thus, blankb=0 is inserted just before clock switching and is released (blankb=1) just after clock switching. CLK_OUT=(CLK_int AND blankb). With the maskb signal deasserted (logic high) the output clock signal CLK_OUT begins to output CLK_A without a glitch and the only rising edge that is suppressed is the rising edge of the glitch at 504. Thus, latency to switch from one clock signal to another asynchronous clock signal is reduced by exploiting the glitch on an internal clock signal to indicate the end of the masking signal blankb.

Figure 6:
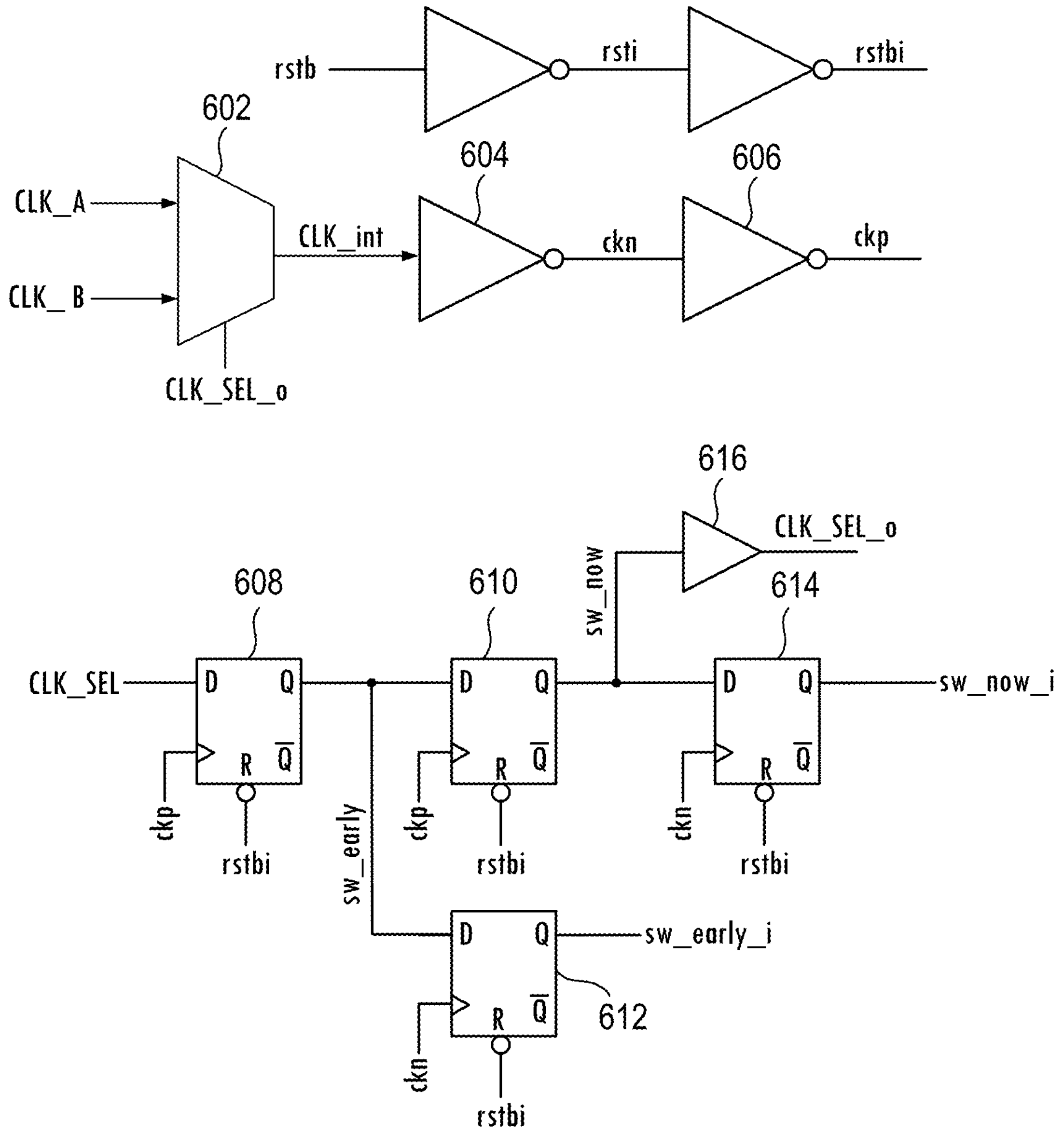
FIG. 6 illustrates an embodiment of logic circuits associated with faster switching.

FIG. 6 illustrates an embodiment of logic circuits associated with the low latency embodiments described herein. The reset signals (rstbi) are used to reset the flip-flop shown in FIG. 6. The multiplexer circuit 602 receives two asynchronous clock signals CLK_A and CLK_B and supplies the input clock signal CLK_int, which is the glitchy clock signal shown in FIG. 5. The two inverters 604 and 606 supply a negative clock signal ckn and a positive clock signal ckp. The CLK_SEL signal is supplied to flip-flop 608, which supplies its Q output to flip-flops 610 and 612. Flip-flops 608 and 610 are clocked by ckp while flip-flop 612 is clocked by ckn. Flip flop 610 supplies its Q output to flip-flop 614, which supplies the sw_now_i signal whose use is described further herein. Flip-flop 612 supplies sw_early_i whose use is described further herein. Flip-flop 610 also supplies sw_now (the delayed select signal), which is redriven by the optional buffer 616, which in turn supplies the delayed select signal CLK_SEL_o to the selector circuit 602.

Figure 7:
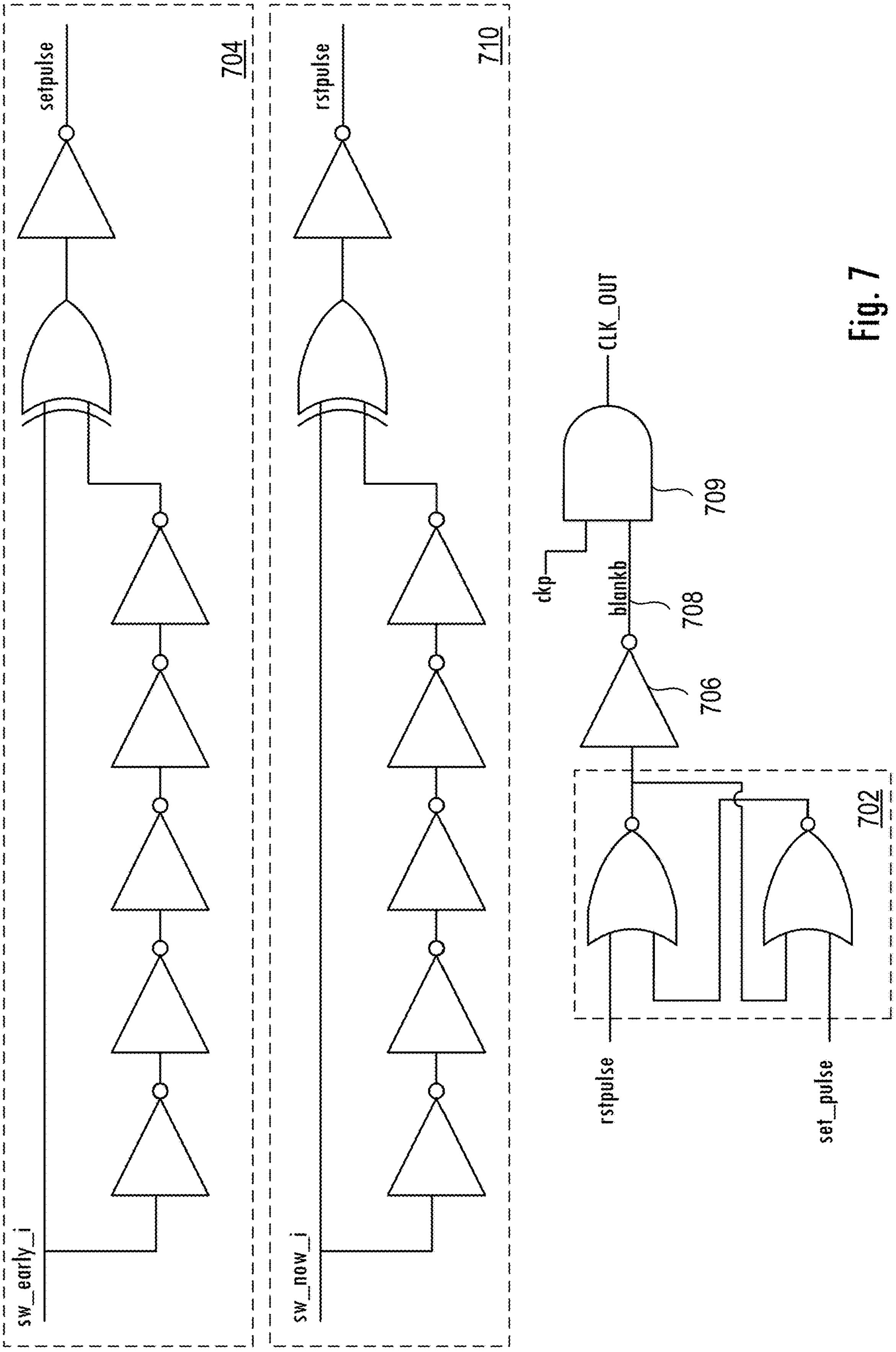
FIG. 7 illustrates pulse generator circuits, a set-reset (SR) latch, and an AND gate used in an embodiment to generate a blanking signal and mask off a glitch in the output clock signal.

FIG. 7 illustrates an SR latch 702 used as part of the masking logic to generate the blankb masking pulse 708 shown in FIG. 5. The pulse generator 704 generates the set_pulse signal, which causes SR latch 702 to generate the rising edge of the blanking signal which is inverted by inverter 706 to generate the falling edge of the blankb signal. The blankb signal is ANDed with the positive clock signal ckp (see FIG. 6) in AND gate 709 to generate the glitch free output clock signal CLK_OUT. The pulse generator 710 generates the reset pulse (rstpulse) supplied to SR latch 702 to cause the blankb signal 708 to deassert (go to a logical 1) to allow ckp to pass through AND gate 709. Pulse generator 704 receives the sw_early_i signal, which is a delayed version of CLK_SEL as shown in FIG. 5. Pulse generator 710 receives the sw_now_i signal, which changes on the rising edge of ckn which is an inverted version of the glitchy internal clock CLK_i. The width of setpulse and rstpulse depends on the length of the inverter chain in the pulse generators 704 and 710.

Figure 8:
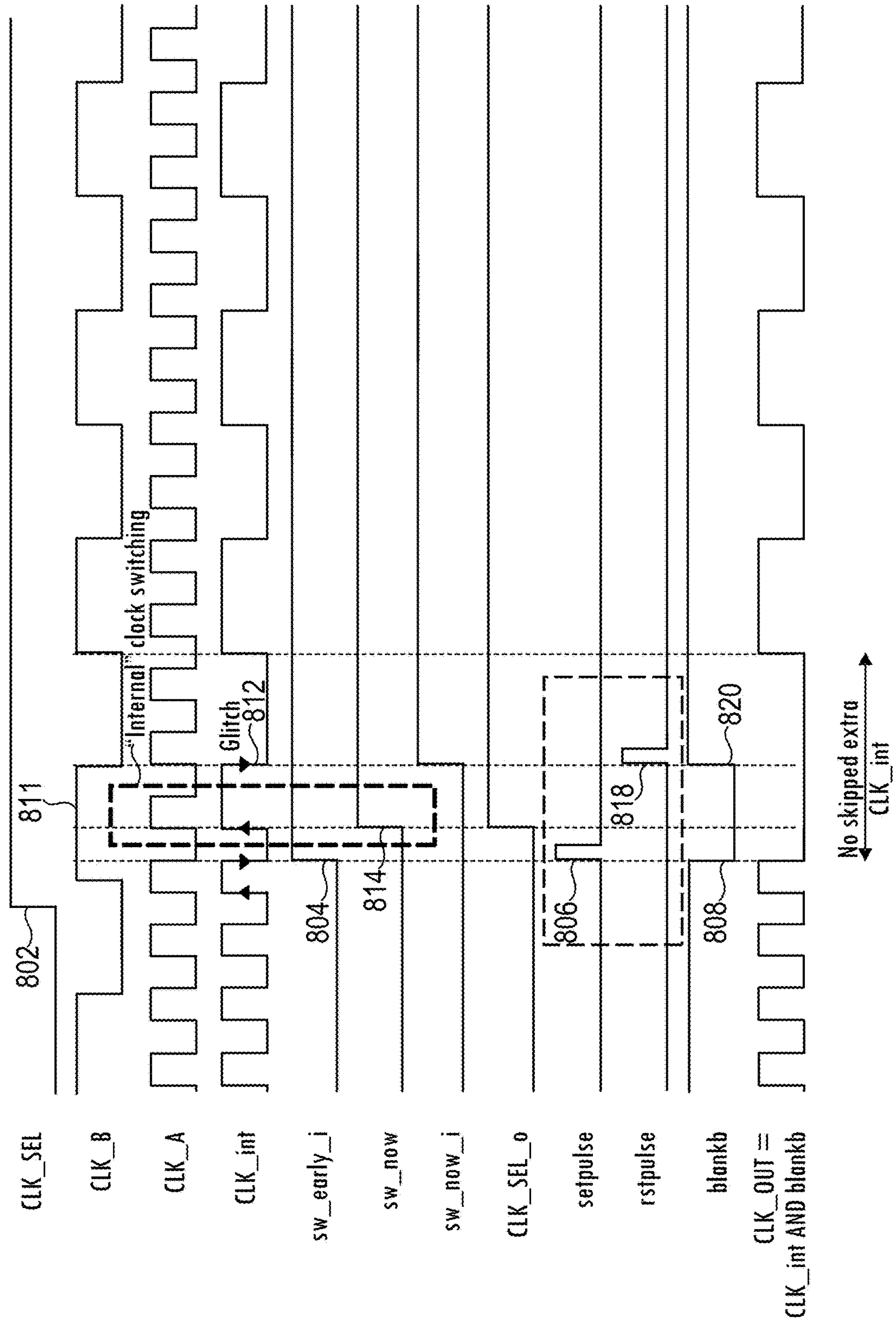
FIG. 8 is a timing diagram illustrating operation of the logic circuits shown in FIGS. 6 and 7.

FIG. 8 is a timing diagram illustrating operation of the logic circuits shown in FIGS. 6 and 7. Referring to FIGS. 6, 7, and 8, initially, the system is selecting CLK_A as CLK_OUT with CLK_SEL at a logical low value. When CLK_SEL toggles high at 802, the system does not switch clocks immediately. Instead, the system synchronizes CLK_SEL using ckp (positive edge CLK_int) using flip-flop 608, which generates sw_early. Flip-flop 612 receives sw_early and generates the early switch signal called sw_early_i using ckn (negative edge CLK_int). SW_early_i has a rising edge at 804. The early switch signal sw_early_i is supplied to the pulse generator 704, which generates the setpulse signal at 806 supplied to SR latch 702. That results in the falling edge of the blankb signal at 808. Thus, the falling edge of the blankb signal is based on the last falling edge of the internal clock signal CLK_int before the internal switch caused by switch_now (CLK_SEL_o). Flip-flop 610 generates the switch now signal (sw_now) using the next rising edge of ckp. Assertion of sw_now at 814 and thus CLK_SEL_o causes the internal clock CLK_int to switch from CLK_A to CLK_B. The switch signal sw_now (CLK_SEL_o after buffer 616) occurs in the middle of the high portion 811 of CLK_B resulting in a narrower positive pulse or glitch shown at 812 on CLK_int. Flip-flop 614 receives the sw_now signal on its D input and generates sw_now_i using ckn (negative edge of CLK_int which has now switched to CLK_B). The sw_now_i signal is supplied to the pulse generator 710, which generates rstpulse for the SR latch at 818 to cause the rising edge of blankb at 820 to disable blankb. Thus, masking the glitch on the output clock signal ends right after clock switching and is based on the negative edge of glitch 812. The blanking signal ends responsive to the first negative edge of CLK_int after the internal switch. The result is a glitch free output CLK_OUT from the AND of ckp and blankb. Note that an extra clock period of the newly selected clock is not skipped, just the clock period with the glitch. Thus, a faster glitchless switch is achieved.

Figure 9:
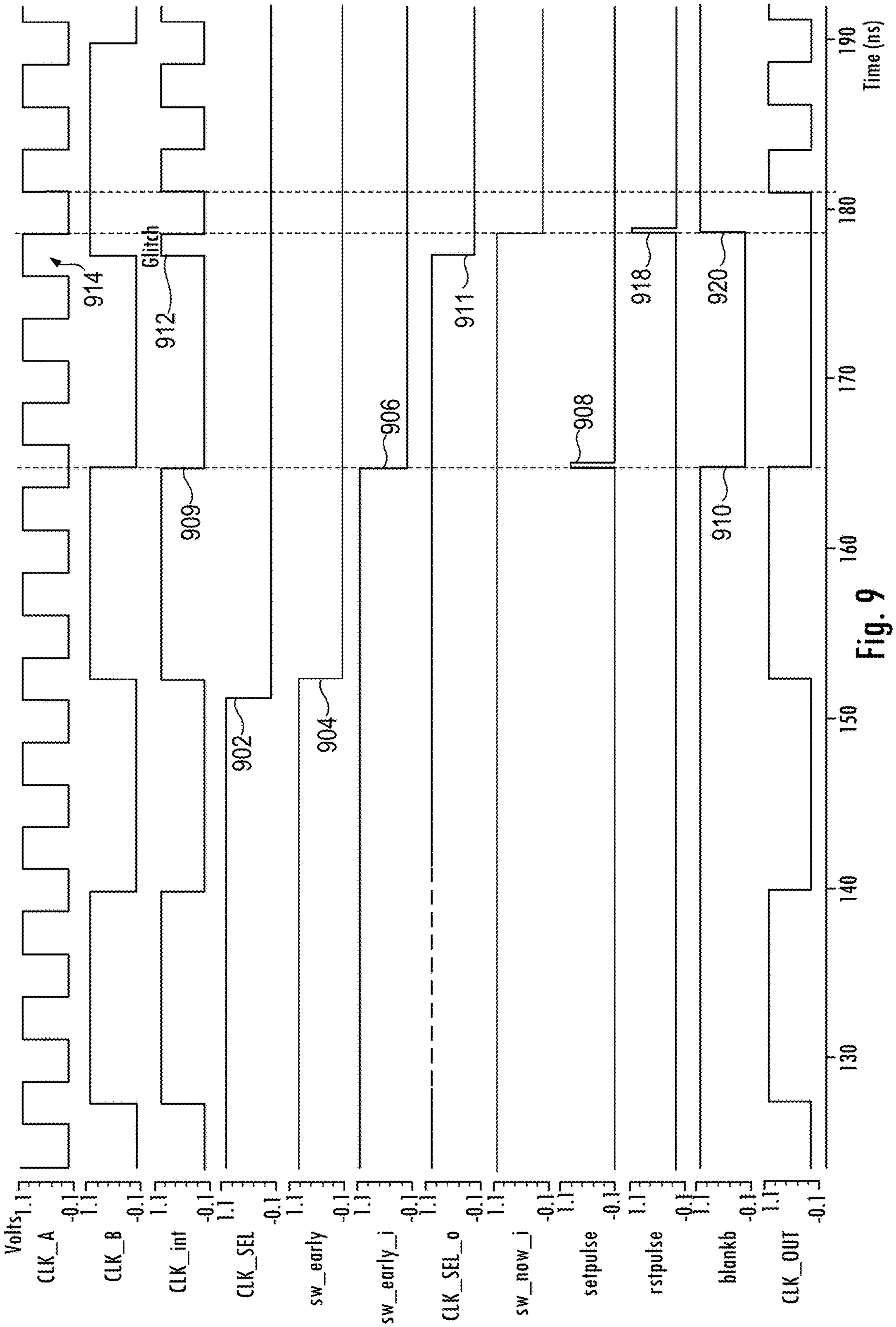
FIG. 9 is a timing diagram illustrating operation of the logic circuits shown in FIGS. 6 and 7.

FIG. 9 is another timing diagram illustrating operation of the circuits illustrated in FIGS. 6 and 7. Referring to FIGS. 6, 7, and 9, initially the system selects CLK_B as CLK_OUT with CLK_SEL at a logical high value. When CLK_SEL toggles low at 902, the system does not switch clocks immediately. Instead, the system synchronizes CLK_SEL using ckp (positive edge CLK_int) using flip-flop 608 to generate sw_early having a falling edge at 904. Flip-flop 612 receives sw_early and generates the early switch signal called sw_early_i using ckn (negative edge CLK_int) having a rising edge at 906. The early switch signal sw_early_i is supplied to the pulse generator 704, which generates the setpulse signal at 908, which is supplied to SR latch 702. That results in the falling edge 910 of the blankb signal. Thus, the blankb signal becomes active responsive to the last falling edge 909 of CLK_int before the internal clock switch. Flip-flop 610 generates the switch now signal (sw_now) using the next rising edge of ckp based on the CLK_int rising edge (corresponding to the CLK_A rising edge) and buffer 616 receives sw_now and supplies CLK_SEL_o, which goes low at 911 resulting in switching of the internal clock CLK_in from CLK_A to CLK_B. Note that the clock switches in the middle of the positive portion 914 of the CLK_A cycle, resulting in a glitch at 912. Flip-flop 614 receives the sw_now signal on its D input and generates sw_now_i using ckn (negative edge of CLK_int). The sw_now_i signal is supplied to the pulse generator 710, which generates rstpulse for the SR latch at 918 to cause the rising edge of blankb at 920 to disable blankb. Thus, the first falling edge of CLK_int after the internal switch results in blankb being disabled. Thus, masking the glitch on the output clock signal ends right after clock switching and is based on the negative edge of glitch 912. The result is a glitch free output CLK_OUT from the AND of ckp and blankb. Note that an extra clock period of the newly selected clock is not skipped, just the clock period with the glitch. Thus, a faster glitchless switch is achieved.

Thus, techniques for glitchless switching between asynchronous clock signals has been described. The description of the invention set forth herein is illustrative and is not intended to limit the scope of the invention as set forth in the following claims. The terms "first," "second," "third," and so forth, as used in the claims, unless otherwise clear by context, are to distinguish between different items in the claims and do not otherwise indicate or imply any order in time, location or quality. Variations and modifications of the embodiments disclosed herein may be made based on the description set forth herein, without departing from the scope of the invention as set forth in the following claims.

What is claimed is:

1. A method comprising:

switching a source for an output clock signal from a first clock signal to a second clock signal according to a change in value of a select signal, the first and second clock signals being asynchronous;

generating a delayed select signal that is a delayed version of the select signal;

generating an internal clock signal according to the delayed select signal, the internal clock signal corresponding to the first clock signal according to a first value of the delayed select signal and the internal clock signal corresponding to the second clock signal according to a second value of the delayed select signal;

generating the internal clock signal with a narrower high portion that is narrower than a high portion of the second clock signal responsive to a change of the delayed select signal, the narrower high portion being indicative of a clock glitch;

generating the output clock signal by logically combining the internal clock signal and a masking signal; and generating the masking signal to mask the clock glitch in the output clock signal.

2. The method as recited in claim 1 further comprising ending the masking signal using a falling edge of the internal clock signal that occurs right after the delayed select signal changes.

3. The method as recited in claim 1 further comprising generating the masking signal using an SR latch.

4. The method as recited in claim 3 further comprising:

supplying the delayed select signal to a multiplexer circuit to select the first clock signal or the second clock signal.

5. The method as recited in claim 3 further comprising:

supplying the select signal to a first flip-flop clocked with a positive edge of the internal clock signal;

supplying a first output signal of the first flip-flop to a second flip-flop clocked with a negative edge of the internal clock signal;

generating a set pulse signal using a second output signal of the second flip-flop; and supplying the set pulse signal to the SR latch to start assertion of the masking signal.

6. The method as recited in claim 5:

supplying the first output signal of the first flip-flop to a third flip-flop clocked with the positive edge of the internal clock signal;

supplying a third output of the third flip-flop to a fourth flip-flop clocked with the negative edge of the internal clock signal;

generating a reset pulse signal using a fourth output signal of the fourth flip-flop; and supplying the reset pulse signal to the SR latch end the masking signal.

7. The method as recited in claim 6 wherein the negative edge of the internal clock signal clocking the fourth flip-flop to generate the fourth output signal is the negative edge of the narrower high portion of the internal clock signal.

8. The method as recited in claim 6 wherein the negative edge of the internal clock signal clocking the second flip-flop to generate the second output signal is the negative edge of a last period of the internal clock signal before the internal clock signal switches from the first clock signal to the second clock signal.

9. An apparatus comprising:

a selector circuit to switch a source for an internal clock signal from a first clock signal to a second clock signal according to an internal switch signal, the first and second clock signals being asynchronous;

wherein the internal clock signal has a narrower high portion than a high portion of the second clock signal during a first period of the internal clock signal after the switch from the first clock signal to the second clock signal, the narrower high portion indicative of a glitch;

masking logic to generate a masking signal that is asserted during the glitch; and a logic circuit to logically combine the internal clock signal and the masking signal to generate an output clock signal.

10. The apparatus as recited in claim 9 wherein a falling edge of the narrower high portion of the internal clock signal is used to disable the masking signal.

11. The apparatus as recited in claim 9 wherein the masking logic further comprises an SR latch used to generate the masking signal.

12. The apparatus as recited in claim 11 further comprising:

a first flip-flop coupled to receive a select signal and the first flip-flop is clocked with a positive edge of the internal clock signal; and a second flip-flop clocked with a negative edge of the internal clock signal and coupled to receive a first output signal of the first flip-flop.

13. The apparatus as recited in claim 12 further comprising:

a first pulse generation circuit to generate a set pulse signal using a second output signal of the second flip-flop; and wherein the set pulse signal is supplied to the SR latch to cause assertion of the masking signal.

14. The apparatus as recited in claim 13:

a third flip-flop clocked with the positive edge of the internal clock signal and coupled to receive the first output signal of the first flip-flop and supply a third output signal;

wherein the internal switch signal corresponds to the third output signal of the third flip-flop; and a fourth flip-flop clocked with the negative edge of the internal clock signal and coupled to receive the third output signal and generate a fourth output signal.

15. The apparatus as recited in claim 14 further comprising:

a second pulse generation circuit coupled to receive the fourth output signal and to generate a reset pulse signal; and wherein the reset pulse signal is supplied to the SR latch to cause deassertion of the masking signal.

16. The apparatus as recited in claim 15 wherein the negative edge of the internal clock signal clocking the fourth flip-flop to generate the fourth output signal is the negative edge of the internal clock signal immediately following a change in the internal switch signal.

17. The apparatus as recited in claim 16 wherein the negative edge of the internal clock signal clocking the second flip-flop to generate the second output signal is the negative edge of a last period of the internal clock signal before the change in the internal switch signal.

18. An apparatus comprising:

a selector circuit to switch a source for an internal clock signal from a first clock signal to a second clock signal responsive to a change in value of a delayed select signal, the first and second clock signals being asynchronous;

wherein the internal clock signal has a narrower high portion during a first period of the internal clock signal after the switch from the first clock signal to the second clock signal, the narrower high portion being narrower than a next high portion of the internal clock signal after the narrower high portion;

masking logic to generate a masking signal that is asserted during the narrower high portion;

a logic circuit to logically combine the internal clock signal and the masking signal to generate an output clock signal; and wherein the masking signal is enabled responsive to a last falling edge of the internal clock signal before the switch and the masking signal is disabled responsive to a first falling edge of the internal clock signal after the switch.

19. The apparatus as recited in claim 18 further comprising:

a first flip-flop coupled to receive a select signal and the first flip-flop is clocked base on a positive edge of the internal clock signal; and a second flip-flop clocked based on a negative edge of the internal clock signal and coupled to receive a first output signal of the first flip-flop;

a third flip-flop clocked based on the positive edge of the internal clock signal and coupled to receive the first output signal of the first flip-flop and supply a third output signal; and a fourth flip-flop clocked based on the negative edge of the internal clock signal and coupled to receive the third output signal and generate a fourth output signal.

20. The apparatus as recited in claim 19 further comprising:

an SR latch;

a first pulse generation circuit to generate a set pulse signal using a second output signal of the second flip-flop; and wherein the set pulse signal is supplied to the SR latch to enable the masking signal;

a second pulse generation circuit coupled to receive the fourth output signal and to generate a reset pulse signal;

wherein the reset pulse signal is supplied to the SR latch disable the masking signal; and wherein the delayed select signal corresponds to the third output signal from the third flip-flop and is a delayed version of the select signal.

* * * * *